(12) United States Patent
Khayyat et al.

(10) Patent No.: US 8,349,715 B2
(45) Date of Patent: Jan. 8, 2013

(54) NANOSCALE CHEMICAL TEMPLATING WITH OXYGEN REACTIVE MATERIALS

(75) Inventors: Maha M. Khayyat, Yorktown Heights, NY (US); Devendra K. Sadana, Yorktown Heights, NY (US); Brent A. Wacaser, Garrison, NY (US)

(73) Assignees: International Business Machines Corporation, Armonk, NY (US); King Abdulaziz City for Science and Technology, Riyadh (SA)

( * ) Notice: Subject to any disclaimer, the term of this patent is extended or adjusted under 35 U.S.C. 154(b) by 218 days.

(21) Appl. No.: 12/696,417

(22) Filed: Jan. 29, 2010

(65) Prior Publication Data

US 2011/0186804 A1    Aug. 4, 2011

(51) Int. Cl.
*H01L 21/20* (2006.01)
(52) U.S. Cl. ............ 438/503; 257/E21.09; 257/E21.211
(58) Field of Classification Search .................. 438/503; 257/E29.002, E29.168, E21.09, E21.211
See application file for complete search history.

(56) References Cited

U.S. PATENT DOCUMENTS

| 8,119,434 B2* | 2/2012 | Cohen ............................. 438/57 |
| 2010/0129549 A1* | 5/2010 | Chan et al. .................. 427/249.1 |

OTHER PUBLICATIONS

Chen et al., "Using colloidal lithography to fabricate and optimize sub-wavelength pyramidal and honeycomb structures in solar cells," Optics Express, vol. 15, No. 22, Oct. 29, 2007, pp. 14793-14803.*
Wacaser, B. A. et al. "Preferential Interface Nucleation: An Expansion of the VLS Growth Mechanism for Nanowires." Advanced Materials 2009, 21 (2), 153-165.
Fan, H. J., et al., "Semiconductor Nanowires: From Self-Organization to Patterned Growth" Small 2006, pp. 700-717, 2, No. 6.

* cited by examiner

*Primary Examiner* — Matthew Landau
*Assistant Examiner* — Colleen E Snow
(74) *Attorney, Agent, or Firm* — Scully, Scott, Murphy & Presser, P.C.; Louis J. Percello, Esq.

(57) ABSTRACT

A method of fabricating templated semiconductor nanowires on a surface of a semiconductor substrate for use in semiconductor device applications is provided. The method includes controlling the spatial placement of the semiconductor nanowires by using an oxygen reactive seed material. The present invention also provides semiconductor structures including semiconductor nanowires. In yet another embodiment, patterning of a compound semiconductor substrate or other like substrate which is capable of forming a compound semiconductor alloy with an oxygen reactive element during a subsequent annealing step is provided. This embodiment provides a patterned substrate that can be used in various applications including, for example, in semiconductor device manufacturing, optoelectronic device manufacturing and solar cell device manufacturing.

20 Claims, 6 Drawing Sheets

NANOSCALE CHEMICAL TEMPLATING WITH OXYGEN REACTIVE MATERIALS

BACKGROUND

In one embodiment, the present invention relates to semiconductor device manufacturing, and more particularly to a method of fabricating semiconductor nanowires on a surface of a semiconductor substrate in which the spatial placement of the semiconductor nanowires is controlled by using an oxygen reactive seed material. The present invention also provides semiconductor structures including semiconductor nanowires. In yet another embodiment, the present invention relates to patterning of a compound semiconductor substrate or other like substrate which is capable of forming a compound semiconductor alloy with an oxygen reactive element during a subsequent annealing step for providing a patterned substrate that can be used in various applications including, for example, in semiconductor device manufacturing, optoelectronic device manufacturing and solar cell device manufacturing.

A nanowire refers to a wire having a diameter from about 1 nm to about 1,000 nm. Implied in the use of the term "nanowire" is the assumption that the length of the nanowire is substantially greater than the diameter of the nanowire. Nanowires having a diameter at a low end of the range, i.e., a diameter from about 1 nm to about 100 nm, exhibit quantum mechanical properties, and are also called "quantum wires." A nanowire may comprise a metallic material, a semiconductor material, or an insulator material. Both organic nanowires, e.g., deoxyribonucleic acid (DNA), and inorganic nanowires are known in the art.

The ratio of the length of a nanowire to the diameter of the nanowire is referred to as an aspect ratio. Typical aspect ratios for nanowires range from 10 to 1,000,000. As such, one dimension, i.e., the length, of a nanowire may be considered to be virtually infinite for practical purposes, while the diameter of the nanowire determines predominant physical and chemical characteristics of the nanowire. Quantum mechanical properties of nanowires due to the limited dimension of the nanowire in the plane perpendicular to the length of the nanowire have been observed in many types of nanowires.

Devices employing semiconductor nanowires have been proposed in the art. One of the challenges in the manufacture of semiconductor devices employing semiconductor nanowires has been the difficulty in the patterning of the nanowires.

There are many known techniques for patterning semiconductor nanowires some of which are discussed in the publication to Hong J. Fan et al. entitled "Semiconductor Nanowires: From Self-Organization to Patterned Growth" Small 2006, 2, No. 6, 700-717. The techniques disclosed in the aforementioned publication employ materials which do not easily react with oxygen in templating the growth of the nanowires. Moreover, many of the materials discussed in the above publication like gold (Au) have detrimental effects on the electrical and/or optical characteristics of the nanowires that are grown.

It has been proven difficult to grow semiconductor nanowires with materials that are more compatible like aluminum (Al). The main difficulty is attributed to the fact that these materials react with oxygen which suppresses their ability to seed the growth of nanowires.

SUMMARY

The nanopatterning of semiconductor and other surfaces in a controlled manner is of great interest for industrial applications. In an aspect of the invention, a method of fabricating semiconductor nanowires on a surface of a semiconductor substrate in which the spatial placement of the semiconductor nanowires is controlled by using a patterned or self organized oxide layer and a non-oxidized oxygen reactive seed material is provided.

In one embodiment, the method includes forming a patterned oxide layer on a surface of a semiconductor substrate. The patterned oxide layer has at least one opening that exposes an upper surface of the semiconductor substrate. The method further includes forming an oxygen reactive element-containing layer on all exposed surfaces of the patterned oxide layer as well as the exposed upper surface of the semiconductor substrate. An anneal is then performed. The anneal causes the oxygen reactive element within the oxygen reactive element-containing layer to react with the oxygen within the patterned oxide layer forming a patterned compound oxide layer that includes a combination of the elements within the patterned oxide layer and the oxygen reactive element-containing layer. For example, when the patterned oxide layer comprises silicon oxide and the oxygen reactive element-containing layer includes Al, the annealing process provides a patterned compound oxide layer that includes atoms of Al, Si and oxygen. The anneal also causes the oxygen reactive element-containing layer that is located atop the exposed semiconductor substrate to ball up forming a non-oxidized semi-sphere or faceted crystal of the oxygen reactive material. The non-oxidized semi-sphere or faceted crystal is used as a seed for nanowire growth in a subsequent processing step. After nanowire growth, the non-oxidized seed material atop the tip of each nanowire can be removed. Also, after nanowire growth, the patterned compound oxide layer can be removed.

In another embodiment of the invention, oxide spheres are employed in place of the patterned oxide layer. This embodiment includes providing a self organized layer of oxide spheres on the surface of a semiconductor substrate. The method further includes forming an oxygen reactive element-containing layer on exposed surfaces of the layer of oxide spheres as well as exposed portions of the semiconductor substrate. An anneal is then performed. The anneal causes the oxygen reactive element within the oxygen reactive element-containing layer to react with the oxygen within the layer of oxide spheres forming a compound oxide layer on the exposed surfaces of the layer of oxide spheres that includes a combination of the elements within the layer of oxide spheres and the oxygen reactive element-containing layer. The anneal also causes the oxygen reactive element-containing layer that is located atop the exposed semiconductor substrate to ball up forming a non-oxidized semi-sphere or faceted crystal of the oxygen reactive material. The non-oxidized semi-sphere or faceted crystal is used as a seed for nanowire growth in a subsequent processing step. After nanowire growth, the non-oxidized seed material atop the tip of each nanowire can be removed. Also, after nanowire growth, the patterned compound oxide layer can be removed.

In yet another embodiment of the invention, polymeric spheres are employed to form a patterned oxide layer on a surface of a semiconductor substrate instead of more traditional photolithography. In this embodiment, a self organized layer of polymeric spheres is formed on an upper surface of an oxide layer which is disposed on an upper surface of a semiconductor substrate. The structure with the polymeric spheres is then subjected to annealing to control the adhesion of the spheres and treatment in oxygen plasma to control the size of the opening between each of the spheres. The annealed and oxygen treated polymeric spheres are employed as an etch mask in a subsequent etching step in which the exposed portions of the oxide layer, which is located under the openings and between the spheres, are etched. This etch process patterns the oxide layer to include at least one opening. The at least one opening in the oxide layer exposes an upper surface of the semiconductor substrate. The annealed and oxygen treated polymeric spheres are then removed and an oxygen reactive element-containing layer is formed on all exposed surfaces of the structure. An annealing step is then performed. The anneal causes the oxygen reactive element within the oxygen reactive element-containing layer to react with the oxygen within the patterned oxide layer forming a patterned compound oxide layer that includes a combination of the elements within the patterned oxide layer and the oxygen reactive element-containing layer. The anneal also causes the oxygen reactive element-containing layer that is located atop the exposed semiconductor substrate to ball up forming a non-oxidized semi-sphere or faceted crystal of the oxygen reactive material. The non-oxidized semi-sphere or faceted crystal is used as a seed for nanowire growth in a subsequent processing step. After nanowire growth, the non-oxidized seed material atop the tip of each nanowire can be removed. Also, after nanowire growth, the patterned compound oxide layer can be removed.

The various methods described above provide a semiconductor structure including a semiconductor substrate having at least one area in which semiconductor nanowires extend upward from a surface thereof and at least one other area that includes a compound oxide material. The at least one other area including the compound oxide material is laterally abutting the at least one area including the semiconductor nanowires.

In another aspect of the invention, a method for patterning a semiconductor material that is capable of forming a compound semiconductor alloy with an oxygen reactive element during a subsequent annealing step in an appropriate environment is provided. The method includes forming a patterned oxide layer having at least one opening located on a surface of the semiconductor substrate. The at least one opening exposes an upper surface of the substrate. An oxygen reactive element-containing layer is then formed on all exposed surfaces, and thereafter an anneal is performed. The anneal causes the oxygen reactive element within said layer to react with the oxygen within the patterned oxide layer forming a patterned compound oxide layer. Unlike the previous embodiments, the oxygen reactive element-containing layer that is located directly on an exposed surface of the semiconductor substrate reacts with a surface portion of the substrate forming an oxygen reactive element-containing compound semiconductor alloy layer on the exposed portion of the substrate.

The above method provides a semiconductor structure including a semiconductor substrate having at least one area including an island of oxygen reactive element-containing compound semiconductor alloy, and at least one other area including an oxygen reactive element-containing compound oxide layer. The at least one other area including the oxygen reactive element-containing compound oxide layer is laterally abutting the least one area including the island of oxygen reactive element-containing compound semiconductor alloy.

DETAILED DESCRIPTION

The present invention, which in some embodiments provides methods for templating nanowire growth utilizing an oxygen active seed layer, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is first made to FIGS. 1-5 which illustrates a method for templating nanowire growth using an oxygen reactive seed material and standard lithography in accordance with one embodiment of the invention. This embodiment of the present invention which is depicted within FIGS. 1-5 begins by first providing the initial structure 10 shown in FIG. 1. The initial structure shown in FIG. 1 includes an oxide layer 14 located on an upper surface of a semiconductor substrate 12. The semiconductor substrate 12 illustrated in FIG. 1 can be comprised of any semiconductor material that does not adversely react with an oxygen reactive element (to be defined in greater detail herein below) to form an oxygen reactive element-containing compound semiconductor alloy.

Figure 1:
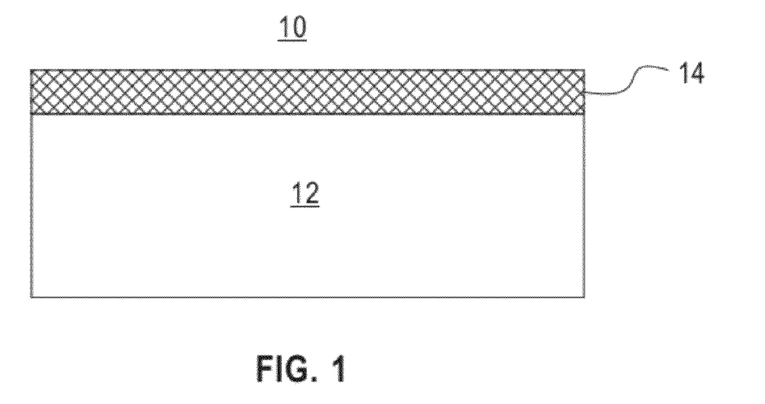
FIG. 1 is a pictorial representation (through a cross sectional view) depicting an initial structure including an oxide layer located on an upper surface of a semiconductor substrate that can be employed in one embodiment of the invention.

Examples of such semiconductor materials include, but are not limited to Si, Ge, SiGe, SiC, and SiGeC. Semiconductor substrate 12 may also comprise an organic semiconductor or a layered semiconductor such as, for example, Si/SiGe, a silicon-on-insulator (SOI), a SiGe-on-insulator (SGOI) or a germanium-on-insulator (GOI). In some embodiments of the present invention, the semiconductor substrate 12 is composed of a Si-containing semiconductor material, i.e., a semiconductor material that includes silicon. In another embodiment of the invention, the semiconductor substrate 12 is comprised of bulk silicon or an SOI substrate. It is noted that III/V or II/VI compound semiconductors, such as, for example, GaAs, GaN, InAs, and InP may be excluded from this embodiment since most would decompose and only one element of the compound semiconductor would form an alloy with an oxygen reactive element during a subsequent anneal, while the other element is released into the ambient in the gas phase. This may exclude the resulting alloy of the one component of the semiconductor and the oxygen reactive material from acting as a seed material for subsequent nanowire growth.

The semiconductor substrate 12 may be doped, undoped or contain doped and undoped regions therein. The dopant (p- or n-type) can be introduced into the semiconductor substrate 12 utilizing techniques that are well known to those skilled in the art. For example, the dopant can be introduced by ion implantation, gas phase doping, or outdiffusion from a dopant source material that is applied to the substrate prior to forming the oxide layer 14.

The semiconductor substrate 12 may be single crystalline, polycrystalline, or amorphous. In one embodiment, the semiconductor substrate 12 is single crystalline.

In one embodiment of the invention, the oxide layer 14 of the initial structure 10 is comprised of a semiconductor oxide such as, for example, silicon oxide, or germanium oxide. In another embodiment of the invention, the oxide layer 14 is comprised of a metal oxide. The oxide layer directly under the oxygen reactive material must be chosen such the two materials react when annealed at the desired temperature. The reaction must cause the oxygen reactive material to oxidize or otherwise become chemically unavailable as a seed material for nanowire growth.

The oxide layer 14 may be comprised of a single oxide material or, it may be comprised of a multilayerd stack of oxide materials such as, for example, a stack of a semiconductor oxide and a metal oxide including, for example, ZnO, NiO, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$. Each value of x is independently from 0.5 to 3 and each value of y is independently from 0 to 2. In one preferred embodiment of the invention, the oxide layer is comprised of silicon oxide.

The thickness of the oxide layer 14 may vary depending on, for example, the technique used in forming the same as well as the type of oxide material that is employed in forming the oxide layer 14. Typically, the oxide layer 14 has a thickness that is greater than 3 nm, with a thickness from 40 nm to 60 nm being more typical in some embodiments of the invention.

The oxide layer 14 can be formed utilizing techniques that are well known to those skilled in the art. In one embodiment of the invention, the oxide layer 14 is formed by a conventional thermal oxidation process. In another embodiment of the invention, the oxide layer 14 is formed by a deposition method including, but not limited to chemical vapor deposition (CVD), plasma enhanced chemical vapor deposition (PECVD), molecular beam deposition (MBE), pulsed laser deposition (PLD), liquid source misted chemical vapor deposition (LSMCVD) and atomic layer deposition. In yet another embodiment of the present invention, the oxide layer 14 can be formed by a layer transfer process. Combinations of the above techniques can also be employed in forming the oxide layer 14.

Figure 2:
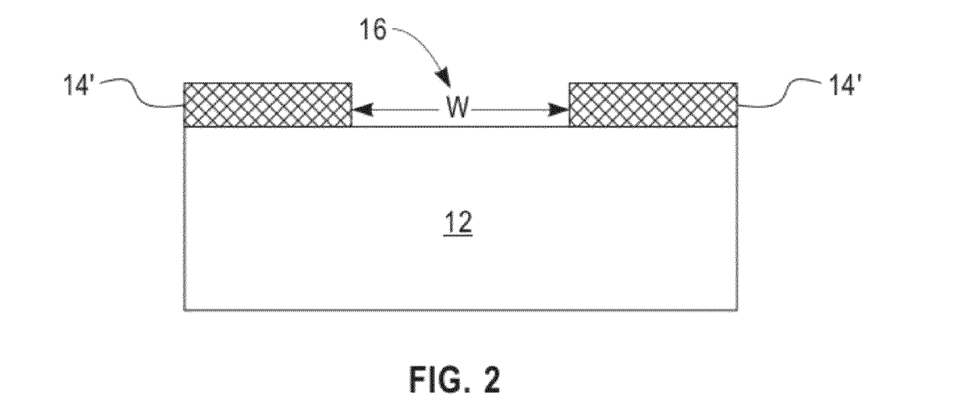
FIG. 2 is a pictorial representation (through a cross sectional view) depicting the initial structure of FIG. 1 after patterning the oxide layer.

Referring now to FIG. 2 there is illustrated the structure of FIG. 1 after patterning the oxide layer 14 into patterned oxide layer 14'. As shown, the patterned oxide layer 14' has at least one opening 16 that exposes an upper surface of the semiconductor substrate 12. Depending on the width, w, of the at least one opening 16, it is possible to grow a single nanowire within the at least one opening 16, or a plurality of nanowires can be grown within the at least one opening. The width, w, of the at least one opening 16 can vary depending on the technique used in forming the same. Typically, each opening 16 that is formed within the oxide layer 14 has a width, w, larger than 50 nm, with a width, w, from 125 nm to 300 nm being more typical for single wires and in the tens of microns being more typical for the patterning of a plurality of wires per opening.

The patterning of the oxide layer 14 into patterned oxide layer 14' is performed by first applying a photoresist (not shown) on an upper exposed surface of the oxide layer 14. The photoresist that can be employed includes any conventional photoresist material including, for example, a positive-tone resist, or a negative-tone resist, that is typically employed in lithography. The photoresist can be applied by a conventional deposition process including, for example, CVD, PECVD, evaporation or spin-on coating. The applied photoresist is then exposed to a desired pattern of radiation, e.g., a via pattern or a line pattern, and thereafter the exposed photoresist is developed utilizing a conventional resist developer. The pattern of the photoresist is transferred to the underlying oxide layer 14 by utilizing one of dry etching (i.e., reactive ion etching, plasma etching, ion beam etching, or laser ablation) or wet chemical etching. In one embodiment, epitaxial growth of nanowires on the semiconductor substrate is desired. For this embodiment, whichever pattern transfer technique and post transfer processing is performed, the exposed semiconductor surface must be epitaxially clean prior to the formation of an oxygen reactive element-containing layer. In the embodiment with single crystal Si as the substrate and silicon oxide as the oxide layer, wet etching with HF or buffered HF can be employed during the pattern transfer process forming the patterned oxide layer 14' and leaving the exposed semiconductor surface epitaxially clean.

Figure 3:
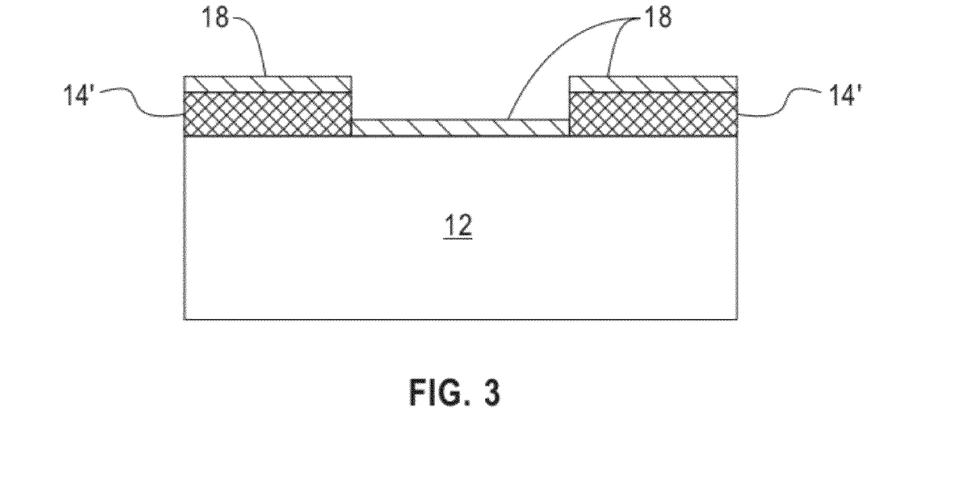
FIG. 3 is a pictorial representation (through a cross sectional view) depicting the structure of FIG. 2 after forming an oxygen reactive element-containing layer on all exposed surfaces of the structure shown in FIG. 2.

Referring now to FIG. 3, there is illustrated the structure of FIG. 2 after forming an oxygen reactive element-containing layer 18 on the exposed surfaces of the structure including on the exposed upper surfaces of the semiconductor substrate 12 as well as the upper surfaces of the patterned oxide layer 14'. The oxygen reactive element-containing layer 18 denotes a material layer that contains at least one element from the Periodic Table of Elements that has a high affinity for reacting and forming a complex with oxygen within the underlying patterned oxide layer 14' during a subsequent annealing process. Such elements can be referred to as oxygen reactive elements. Examples of 'oxygen reactive elements' that can be present within the oxygen reactive element-containing layer 18 include, but are not limited to Al, In, Ga, Ti, Mg, Ca and Sn. In one embodiment, Al is employed as the oxygen reactive element.

The oxygen reactive element-containing layer 18 can be formed utilizing any deposition process including, for example, evaporation, chemical vapor deposition (CVD), ultra high vacuum chemical vapor deposition (UHVCD), plasma enhanced chemical vapor deposition (PECVD), atomic layer deposition (ALD), sputtering, and plating. Whichever technique is employed, the oxygen reactive element-containing layer 18 should not be directly exposed to air or an oxygen containing environment prior to nanowire growth. In one embodiment of the invention, evaporation is employed inside of the load lock chamber of an UHCVD system for forming the oxygen reactive element-containing layer 18 and the structure is not removed from the UHV environment until after the nanowires are grown.

The thickness of the oxygen reactive element-containing layer 18 may vary depending on the technique used in forming the layer as well as the oxygen reactive element and the type of patterned oxide layer employed. The oxygen reactive element-containing layer 18 should be thin enough so that the chemical reaction with the underlying oxide layer makes the entire oxygen reactive element-containing layer over the oxide layer unavailable to act as a seed for nanowire growth. Typically, the thickness of the oxygen reactive element-containing layer 18 is from 0.5 nm to 100 nm, with a thickness from 2 nm to 10 nm being more typical.

Figure 4:
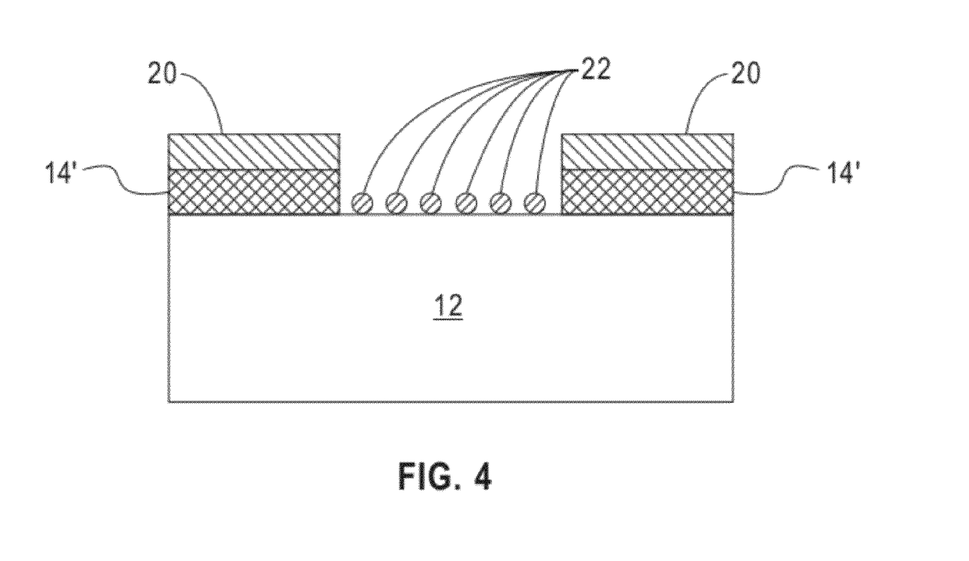
FIG. 4 is a pictorial representation (through a cross sectional view) depicting the structure of FIG. 3 after performing an annealing step.

Referring now to FIG. 4, there is illustrated the structure of FIG. 3 after performing an annealing process. As is illustrated in FIG. 4, the annealing process employed in the present invention causes the oxygen reactive element within layer 18 to react with the oxygen within the patterned oxide layer 14' forming a patterned compound oxide layer 20 that includes a combination of the elements within layers 14' and 18. For example, when the patterned oxide layer 14' comprises silicon oxide and the oxygen reactive element-containing layer 18 includes Al, the annealing process provides a patterned compound oxide layer 20 that includes atoms of Al, Si and oxygen. This layer is no longer active as a seed for nanowire growth.

It is observed that the above mentioned reaction occurs in areas in which the oxygen reactive element-containing layer 18 is in direct contact with the patterned oxide layer 14'. It is further observed that both layers 14' and 18 can be completely or partially consumed during this annealing process. In some embodiments of the invention, a portion of the patterned oxide layer 14' which is in proximity to the upper surface of semiconductor substrate 12 is not completely consumed. It is even yet further observed that in the areas of the structure in which the oxygen reactive element-containing layer 18 is located directly on an exposed surface of the semiconductor substrate 12, the oxygen reactive element-containing layer 18 balls up forming a non-oxidized semi-sphere or faceted crystal of the oxygen reactive material. The non-oxidized semi-sphere or faceted crystal, which is comprised of the same material as the non-oxidized oxygen reactive element-containing layer 18, can be used as a non-oxidized seed material 22 for nanowire growth.

The structure shown in FIG. 4 thus includes areas conducive for nanowire growth (e.g., areas including the non-oxidized seed material 22 on the surface of the semiconductor substrate 12), and areas that are not conducive for nanowire growth (e.g., areas including the patterned compound oxide layer 20).

The annealing process that is employed in this step of the invention may include a furnace anneal, a laser anneal, a microwave anneal, or a rapid thermal anneal. In one embodiment, the anneal includes a furnace anneal in an UHVCVD chamber. Notwithstanding the type of anneal employed, the anneal is typically performed at a temperature that is equal to, or greater than the eutectic temperature of the alloy of the oxygen reactive material and the semiconductor substrate. This helps in the non-reacted oxygen reactive material ball up. In some embodiments, the anneal is performed at a temperature that is equal to, or greater than, 200° C. In one embodiment in which Al on Si is employed, the anneal is typically performed at a temperature above 577° C., with a temperature from 600° C. to 750° C. being more typical. For some combinations of patterned oxide and oxide reactive materials much higher temperatures as high as 2000° C. may be needed to completely react the oxide reactive materials above the patterned oxide areas. In one embodiment of the invention, the annealing process can be conducted in an inert atmosphere including, for example, helium, argon, xenon and mixtures thereof. In yet another embodiment of the invention, a forming gas ambient can be employed. In yet another embodiment, an ultra high vacuum environment can be used. Irrespective of which type of inert or reducing atmosphere is used the level of oxygen must be such that the oxygen reactive material is not oxidized in the areas where the non-oxidized seed material 22 is designed to form. The annealing process may employ a single temperature, or various ramp and soak cycles can be employed.

Figure 5:
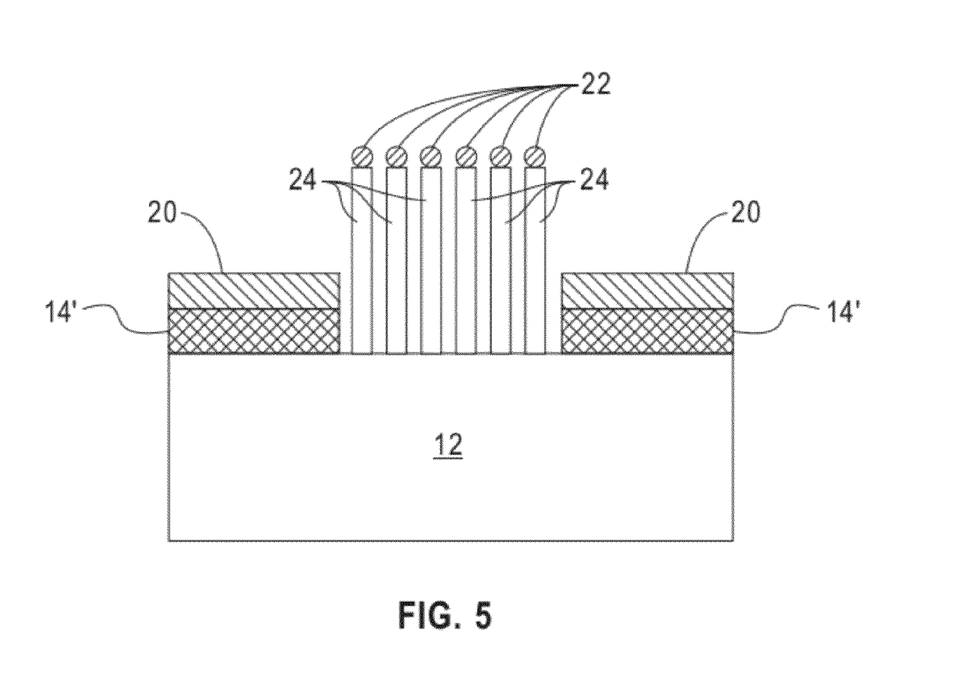
FIG. 5 is a pictorial representation (through a cross sectional view) illustrating the structure of FIG. 4 after nanowire growth.

Referring now to FIG. 5, there is illustrated the structure of FIG. 4 after growing semiconductor nanowires 24 from the non-oxidized seed material 22. The growth of the semiconductor nanowires 24, which is assisted by the non-oxidized seed material 22, is typically carried out by chemical vapor deposition (CVD), ultra high vacuum chemical vapor deposition (UHCVD), or plasma enhanced chemical vapor deposition (PECVD) utilizing any of the well known semiconductor nanowire precursors. The nanowire precursors can be in liquid form, gaseous form or in vaporous form. The growth temperature may vary depending on the type of semiconductor nanowire precursor employed. Typically, the nanowires are grown at a temperature from 200° C. to 2000° C., with a growth temperature from 430° C. to 700° C. being more typical. The pressure employed in growing the nanowires may vary depending on the growth temperature, the type of precursor employed as well as the type of reactor employed in forming the nanowires. Typically, the pressure employed in forming the semiconductor nanowires 24 is from 0.01 torr to 760 torr, with a pressure from 0.1 ton to 10 torr being more typical. Examples of semiconductor nanowire precursors that can be employed in forming the semiconductor nanowires 24 include any Si-containing precursor such, for example, silane ($SiH_4$) and chlorosilanes.

In one embodiment, and when silane ($SiH_4$) is used to grow silicon nanowires, the growth temperature is typically from 430° C. to 520° C. In another embodiment in which other precursors such as, for example, silicon tetrachloride ($SiCl_4$), are employed as the semiconductor nanowire precursor the growth temperature is typically from 800° C. to 1200° C. By adding chlorine to $SiH_4$, the growth temperature can be raised to above 600° C. The growth rate of the semiconductor nanowires 24 depends on the growth temperature and the gas pressure in the growth chamber. For example, a typical CVD growth rate of silicon nanowires grown with $SiH_4$ diluted with $H_2$ (1:1) at a pressure of 1 torr and a growth temperature of 450° C. is about 7.6 μm/hour.

Without wishing to be bound by any theory, the growth of semiconductor nanowires is believed to be best described by the vapor-liquid-solid (VLS) mechanism. See, for example, B. A. Wacaser et al. "Preferential Interface Nucleation: An Expansion of the VLS Growth Mechanism for Nanowires." Advanced Materials 2009, 21 (2), 153-165. During the annealing step and or/when the growth is initiated, a metallic-semiconductor solid or liquid alloy is formed. With additional supply of semiconductor precursor from the gas phase, the metallic-semiconductor droplet becomes supersaturated with semiconductor material and the excess semiconductor is deposited at the solid-liquid interface. As a result, the liquid droplet rises from the original substrate surface to the tip of a growing nanowire crystal. After semiconductor nanowire 24 growth, the metallic semiconductor liquid alloy will partially separate during cooling forming a metal-semiconductor solid alloy. As a result the liquid or solid alloy reverts back to material comprised primarily of the non-oxidized seed material 22 after cooling.

The orientation of each of the semiconductor nanowires 24 can be the same as that of the underlying semiconductor substrate 12 since it is formed from that layer. For example, when the underlying semiconductor substrate 12 has a (111) orientation, then the semiconductor nanowire 24 orientation is (111) as it is seeded from the semiconductor substrate. The fabrication of nanocrystals by nanowire growth facilitates the formation of nanocrystals with near identical length, size, and orientation. Selective nanowire growth can also be achieved on other crystal orientations including, but not limited to (100), (110), (211) and (311).

The semiconductor nanowires 24 that are formed may comprise the same or different semiconductor material as that of semiconductor substrate 12. In one embodiment of the invention, the semiconductor nanowires 24 are comprised of a Si-containing semiconductor material, with silicon nanowires being preferred.

Each semiconductor nanowire 24 that is grown may be doped, undoped or contain a combination of doped regions and undoped regions. When doped, the dopant may be introduced to the semiconductor nanowires during the growth of the nanowires itself, i.e., utilizing an in-situ doping growth process, or the dopants may be introduced into the semiconductor nanowires after growing the semiconductor nanowires utilizing an ex-situ doping technique. Ex-situ doping includes ion implantation, gas phase doping, out diffusion of dopants from a sacrificial layer formed about the grown nanowires or any combination of these doping technique. The dopant may be an n-type dopant or a p-type dopant. In one embodiment of the invention, in-situ doping can include the use of a precursor such as phosphine ($PH_3$) for n-type doping, which is co-flowed with silane during the nanowire growth. Other precursors such as tertiarybutylarsine (TBAs) and phosphine (TBP) can also be used.

In one embodiment of the invention, a p-i-n semiconductor nanowire can be formed utilizing one of the doping techniques mentioned above. The semiconductor nanowires 24 that are formed have a length, l, as measured from the base of the semiconductor substrate 12 to the tip of the semiconductor nanowire 24 from 200 nm to 20000 nm, with a length from 1000 nm to 10000 nm being more typical.

In some embodiments of the invention, the non-oxidized seed material 22 can be removed from the tip of each of the semiconductor nanowires 24 by selective etching. For example, HF will selectively etch an Al oxygen reactive seed material from the tip of each of the semiconductor nanowires 24. In yet other embodiments of the invention, the patterned compound oxide layer 20, and optionally, any remaining portions of the patterned oxide layer 14' not previously consumed during annealing can be removed from the surface of the substrate utilizing a conventional etching process that is capable of selectively removing the patterned compound oxide layer 20 from the structure. In one embodiment, etching in HF can be used to selectively remove the patterned compound oxide layer 20 from the structure.

The surfaces (top and sidewalls) of the semiconductor nanowires 24 and, if exposed, the underlying semiconductor substrate 12 can be cleaned to remove any native oxide therefrom utilizing a stripping process that is well known to those skilled in the art.

Figure 6A:
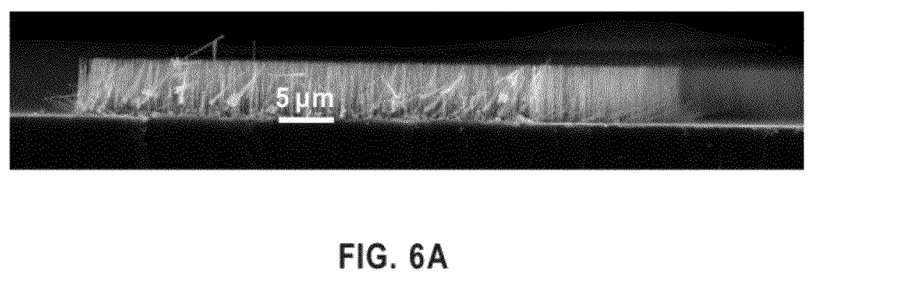
FIGS. 6A and 6B are actual SEM micrographs depicting the templated nanowire growth with Al achieved using the basic processing steps illustrated in FIGS. 1-5.
Figure 6B:
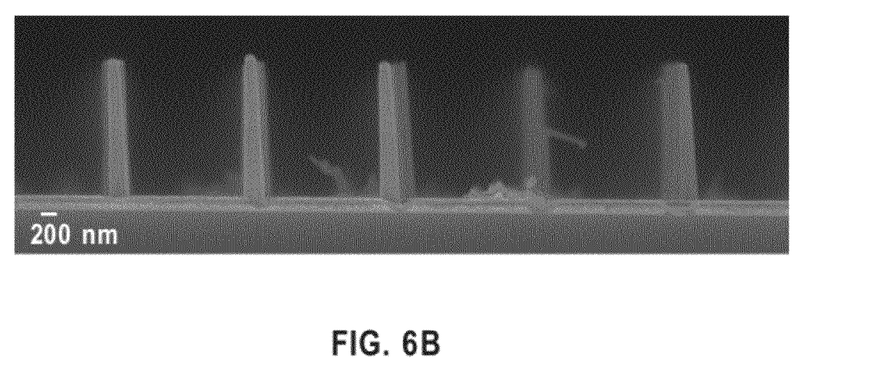

Reference is now made to FIGS. 6A and 6B which are actual SEMs of semiconductor structures including semiconductor nanowires that are formed utilizing the processing described above. FIG. 6A shows a plurality of nanowires grown from an single opening seen in the cross section. The resultant structure includes semiconductor nanowires approximately 8 μm long prior to etching of the patterned compound oxide layer. It is noted that no wires grow on the patterned compound oxide, but they grow where the semiconductor substrate was exposed. FIG. 6B shows a magnified view of a single nanowire per opening in the patterned oxide surface.

Reference is now made to FIGS. 7-10 which illustrate another method for templating nanowire growth using an oxygen reactive seed material without standard lithography in accordance with another embodiment of the invention. This embodiment of the present invention which is depicted within FIGS. 7-10 begins by first providing the initial structure 100 shown in FIG. 7. The initial structure 100 shown in FIG. 7 includes a self organized layer of oxide spheres 102 located on an upper surface of semiconductor substrate 12. The semiconductor substrate 12 employed in this embodiment of the present invention includes one of the semiconductor materials described above for the semiconductor substrate described in the embodiment depicted in FIGS. 1-5.

Figure 7:
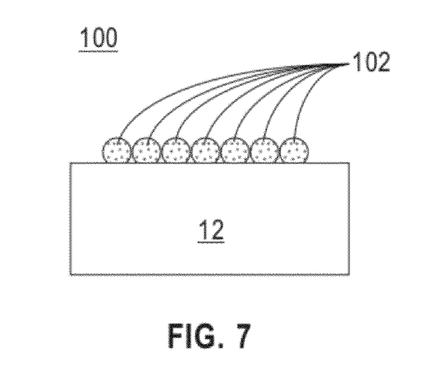
FIG. 7 is a pictorial representation (through a cross sectional view) illustrating an initial structure including a layer of oxide spheres located on an upper surface of a semiconductor substrate that can be employed in another embodiment of the invention.

The layer of oxide spheres 102 is comprised of one of the oxide materials mentioned for oxide layer 14. In one embodiment, each oxide sphere is composed of a silicon oxide sphere. The layer of oxide spheres is formed utilizing a conventional nanosphere spinning process or any other conventional deposition process that is capable of forming such a self organized layer of oxide spheres. After the layer of oxide spheres 102 has been deposited, the layer of oxide spheres 102 can be annealed to promote adhesion. The anneal is performed utilizing the annealing processes and atmospheres mentioned below for the embodiment including the polymeric spheres. Typically, the anneal is performed at a temperature from 500° C. 1000° C. and the spheres can be trimmed with a selective etch such as HF. The surfaces of the spheres can be cleaned by exposing them to an appropriate chemical like HF.

Figure 8:
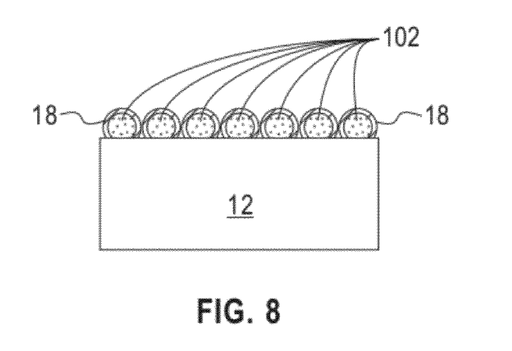
FIG. 8 is a pictorial presentation (through a cross sectional view) illustrating the structure of FIG. 7 after forming an oxygen reactive element-containing layer on all the exposed surfaces of the structure shown in FIG. 7.

Referring now to FIG. 8, there is depicted the structure of FIG. 7 after forming an oxygen reactive element-containing layer 18 on all exposed surfaces of the structure including, for example, around all exposed surfaces of the layer of oxide spheres 102 and any exposed surface of the semiconductor substrate 12. The oxygen reactive element-containing layer 18 employed in this embodiment of the invention includes one of the oxygen reactive elements mentioned above in the first embodiment of the invention. The oxygen reactive element-containing layer 18 has a thickness as described above in the first embodiment, and one of the above mentioned techniques can be employed in forming the oxygen reactive element-containing layer 18.

Figure 9:
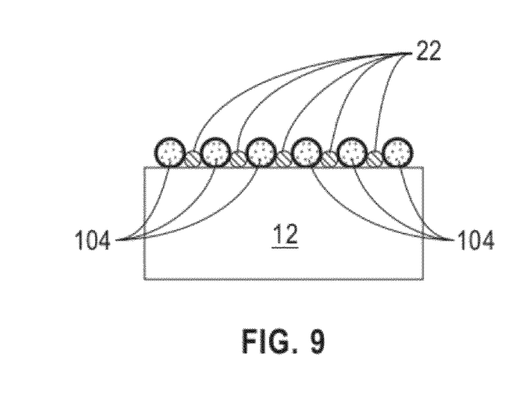
FIG. 9 is a pictorial representation (through a cross sectional view) illustrating the structure of FIG. 8 after performing an annealing step.

Referring now to FIG. 9, there is illustrated the structure of FIG. 8 after performing an annealing process. The anneal process used in this embodiment of the invention is the same as that described above in the first embodiment. The anneal causes the oxygen reactive element within layer 18 to react with the oxygen within the layer of oxide spheres forming a layer of compound oxide on the exposed surfaces of the layer of oxide spheres that include a combination of the elements within the layer of oxide spheres 102 and layer 18. The layer of oxide spheres including the layer of compound oxide is labeled as element 104 in the drawings. For example, when the oxide spheres comprise silicon oxide and the oxygen reactive element-containing layer 18 includes Al, the annealing process provides a compound oxide layer on the spheres that include atoms of Al, Si and oxygen. It is observed that the above mentioned reaction occurs in areas in which the oxygen reactive element-containing layer 18 is in direct contact with the layer of oxide spheres 102. It is further observed that both the layer of oxide spheres 102 and layer 18 can be completely or partially consumed during this annealing process. In some embodiments, some portion, typically a core portion, of the layer of oxide spheres 102 remains which is surrounded by a shell including the oxygen reactive element. It is even yet further observed that in the areas of the structure in which the oxygen reactive element-containing layer 18 is located directly on an exposed surface of the semiconductor substrate 12, the oxygen reactive element-containing layer 18 balls up forming a non-oxidized semi-sphere or faceted crystal of the oxygen reactive material. The non-oxidized semi-sphere or faceted crystal, which is comprised of the same material as the non-oxidized oxygen reactive element-containing layer 18, can be used as a non-oxidized seed material 22 for nanowire growth.

The structure shown in FIG. 9 thus includes areas conducive for nanowire growth (e.g., areas including the non-oxidized seed material 22 on the surface of the semiconductor substrate 12), and areas that are not conducive for nanowire growth (e.g., areas including the layer of oxide spheres 104).

Figure 10:
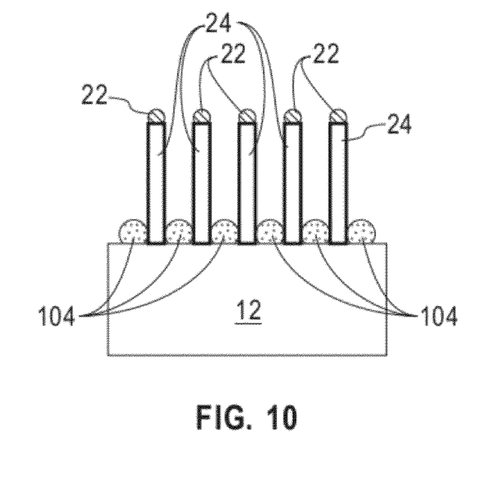
FIG. 10 is a pictorial representation (through a cross sectional view) illustrating the structure of FIG. 9 after nanowire growth.

Referring now to FIG. 10, there is illustrated the structure of FIG. 9 after semiconductor nanowire 24 growth. The semiconductor nanowires 24 formed in this embodiment of the present application are the same as that described above in FIGS. 1-5. Also, one of the above techniques can be used in growing the semiconductor nanowires 24. As described above in the embodiment depicted in FIGS. 1-5, the semiconductor nanowires 24 can be undoped, doped or contain intrinsic (e.g., undoped) regions and doped regions. The non-oxidized seed material 22 at the tip of the grown semiconductor nanowire can be removed as described above. Also, the layer of oxide spheres 104 may remain on the surface of the semiconductor substrate 12 or the layer can be removed utilizing an etching process as described above for the embodiment depicted in FIGS. 1-5.

Reference is now made to FIGS. 11-16 which illustrate another method for templating nanowire growth using an oxygen reactive seed material without standard lithography in accordance with another embodiment of the invention. This embodiment of the present invention which is depicted within FIGS. 11-16 is similar to the embodiment depicted FIGS. 7-10 in that spheres are employed. Unlike the embodiment illustrated in FIGS. 7-10, this embodiment utilizes polymeric spheres within the initial structure. The polymeric spheres can be annealed to reform the spheres into semi-spheres and promote adhesion to the underlying oxide surface. The spheres can also be treated in an oxygen plasma to trim the spheres and control the opening size between the spheres. The polymeric spheres are used as an etch mask during patterning of an underlying oxide layer.

Figure 11:
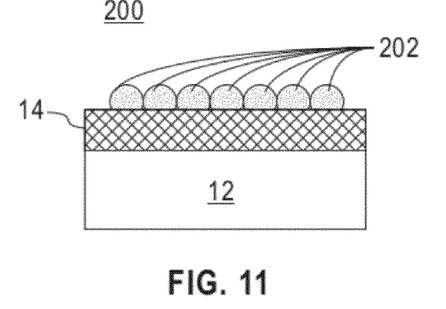
FIG. 11 is a pictorial representation (through a cross sectional view) illustrating an initial structure including a layer of polymeric spheres located on an upper surface of an oxide layer which is disposed on an upper surface of a semiconductor substrate that can be employed in yet another embodiment of the invention.

In particular, this embodiment of the invention begins by first providing the initial structure 200 shown in FIG. 11. The initial structure 200 includes a semiconductor substrate 12, an oxide layer 14 located on the surface of semiconductor substrate 12, and a self organized layer of polymeric spheres 202 located on the upper exposed surface of the oxide layer 14.

The semiconductor substrate 12 and the oxide layer 14 used in this embodiment are the same as those described above for the embodiment depicted in FIGS. 1-5.

The layer of polymeric spheres 202 includes any polymeric material such as, for example, polystyrene, PMMA, melamine, and polylactide. These spheres can be fabricated using techniques well known in the art or they can be purchased commercially. See, for example, htt://www.microspheres-nanospheres.com/ In one embodiment, the layer of polymeric spheres 202 can be formed utilizing any conventional process similar to those used for the oxide spheres.

Figure 12:
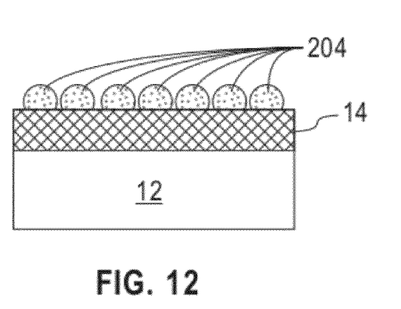
FIG. 12 is a pictorial representation (through a cross sectional view) illustrating the structure of FIG. 11 after annealing and treatment of the annealed polymeric spheres with oxygen.

Referring now to FIG. 12, there is shown the structure of FIG. 11 after annealing and treating the layer of polymeric spheres 202 with oxygen plasma. The anneal and treatment with oxygen plasma converts the layer of polymeric spheres 202 into polymeric semi-spheres 204 with the shape controlled by the annealing and plasma processes. The annealing that is employed at this point of the invention may include a furnace anneal, a laser anneal, a microwave anneal, or a rapid thermal anneal. Notwithstanding the type of anneal employed, the anneal is typically performed at a temperature that is equal to, or greater than, 100° C., with a temperature from 125° C. to 200° C. being more typical. In one embodiment of the invention, the annealing process used in forming the layer of polymeric spheres 204 can be conducted in an inert atmosphere including, for example, helium, argon, xenon and mixtures thereof. In yet another embodiment of the invention, a forming gas ambient can be employed. In yet a further embodiment, annealing may be performed in the presence of an oxygen-containing ambient such as, for example, oxygen, and steam. The annealing process may employ a single temperature, or various ramp and soak cycles can be employed. After performing the above described anneal, the annealed polymeric spheres are treated in an oxygen containing plasma trimming the polymeric spheres 204 and cleaning the exposed regions between the spheres from any residues deposited during previous processing.

Figure 13:
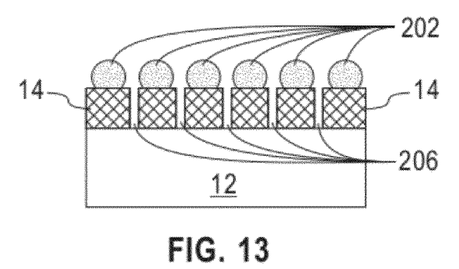
FIG. 13 is a pictorial representation (through a cross sectional view) illustrating the structure of FIG. 12 after etching exposed portions of the oxide layer that are not protected by the annealed and oxygen treated polymeric spheres.

Referring now to FIG. 13, there is illustrated the structure of FIG. 12 after etching exposed portions of the oxide layer 14 that are not protected by the annealed and oxygen treated polymeric spheres, i.e., polymeric spheres 204. The etch used in this step forms at least one opening 206 within the oxide layer 14 and converts oxide layer 14 into patterned oxide layer 14'. The width, w, of the at least one opening 206 that is formed after etching is from 5 nm to 1000 nm, with a width, w, from 25 nm to 200 nm being more typical. The at least one opening 206 is etched to a depth that exposes at least the upper surface of the underlying semiconductor substrate 12.

The etch used in this point of the invention in patterning oxide layer 14 into patterned oxide layer 14' having the at least one opening 206 includes an etch that selectively removes the exposed surface of oxide layer 14 relative to the non-exposed core portions of the polymeric spheres 204. The etchant schemes here are the same as for the ones used previously for FIGS. 1-5.

Figure 14:
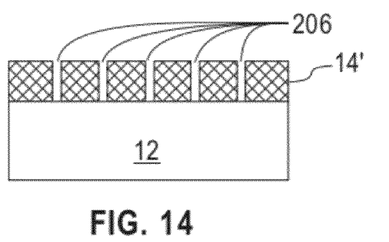
FIG. 14 is a pictorial representation (through a cross sectional view) illustrating the structure of FIG. 13 after removing the annealed and oxygen treated polymeric spheres.

Referring now to FIG. 14, there is illustrated the structure of FIG. 13 after removing the annealed and oxygen treated polymeric spheres i.e., polymeric spheres 204, from the patterned oxide layer 14'. Polymeric spheres 204 can be removed by a planarization process including, for example, chemical mechanical polishing and/or grinding. Alternatively, the polymeric spheres 204 can be removed from the surface of the patterned oxide 14' by etching using an etch chemistry that is selective for the removal of the polymeric spheres 204. An example of one etch chemistry that can be used to remove the polymeric spheres 204 is oxygen plasma or wet chemicals like resist remover. After this process a thin oxide layer may form on the exposed semiconductor surface. This can be removed with a suitable selective etch directly before the next processing steps. For patterned silicon oxide on a silicon surface a 5-10 second dip in 10% HF can be employed to remove the thin oxide in the exposed regions without significantly affecting the thickness of the patterned silicon oxide layer.

Figure 15:
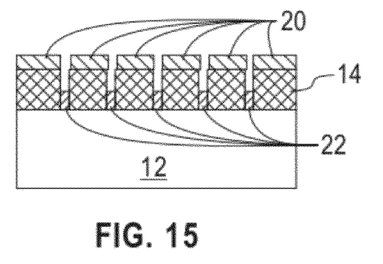
FIG. 15 is a pictorial representation (through a cross sectional view) illustrating the structure of FIG. 14 after forming an oxygen reactive element-containing layer on all exposed surfaces and annealing.

Referring to FIG. 15, there is depicted the structure of FIG. 14 after forming an oxygen reactive element-containing layer on all exposed surfaces of the structure and after annealing. The oxygen reactive element-containing layer and the methods of forming the same are the same as described above for the embodiment depicted in FIGS. 1-5. The anneal, which causes the oxygen reactive element within the layer to react with the oxygen within the patterned oxide layer forming a patterned compound oxide layer 20 that includes a combination of the elements within the patterned oxide layer and the oxygen reactive element-containing layer, while balling up the oxygen reactive element-containing layer located on the exposed semiconductor substrate material 12 into a non-oxidized seed material 22, is the same as described above in the embodiment depicted in FIGS. 1-5. The structure shown in FIG. 15 thus includes areas conducive for nanowire growth (e.g., areas including the non-oxidized seed material 22 on the surface of the semiconductor substrate 12), and areas that are not conducive for nano wire growth (e.g., areas including the patterned compound oxide layer 20).

Figure 16:
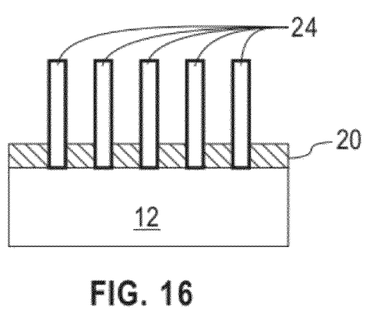
FIG. 16 is a pictorial representation (through a cross sectional view) illustrating the structure of FIG. 15 after nanowire growth.

Referring to FIG. 16, there is shown the structure of FIG. 15 after semiconductor nanowire 24 growth and removal of the seed material 22 from the tip of the nanowire; this drawing shows an embodiment in which the previously described annealing process completely consumed layers 14' and 18. The details concerning nanowire growth and removal of the oxygen reactive seed material 22 that can be employed here for this embodiment are the same as those described above in the embodiment described in FIGS. 1-5. As was the case in the embodiment described in FIGS. 1-5, the nanowires 24 grown in this embodiment have the same characteristics as described above, and it is also possible to form intrinsic (undoped) nanowires, doped nanowires, and a combination of doped and undoped nanowires. In some embodiments of the invention, layer 20 can be removed after nanowire growth utilizing an etching process as previously mentioned above.

Figure 17:
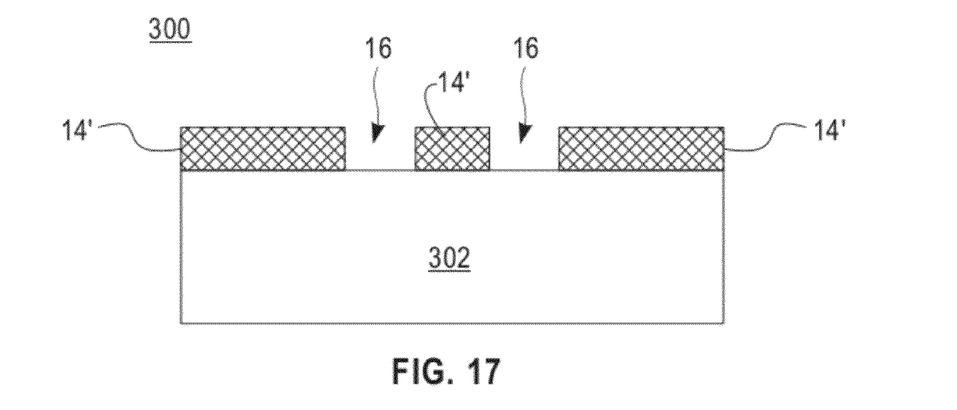
FIG. 17 is a pictorial representation (through a cross sectional view) illustrating an initial structure including a patterned oxide layer located on an upper surface of a semiconductor substrate which is capable of forming a compound semiconductor alloy with an oxygen reactive element upon annealing in an appropriate environment.
Figure 18:
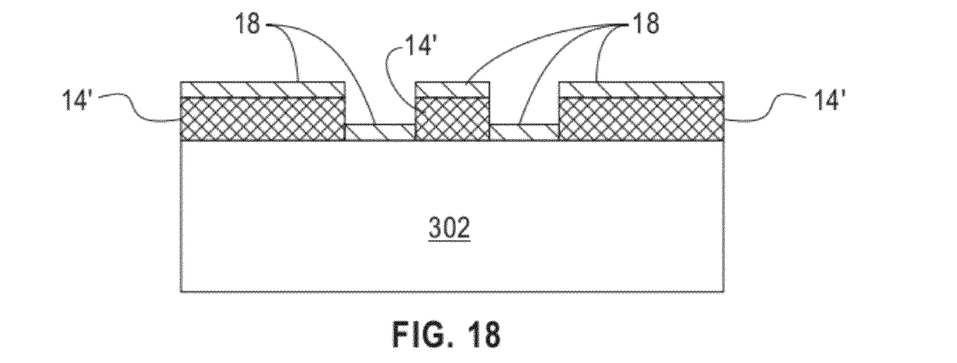
FIG. 18 is a pictorial representation (through a cross sectional view) illustrating the structure of FIG. 17 after forming an oxygen reactive element-containing layer on all exposed surfaces.
Figure 19:
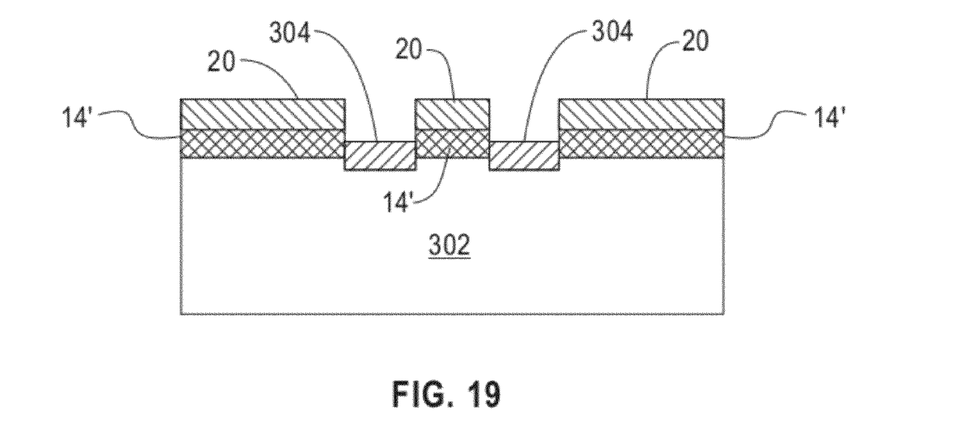
FIG. 19 is a pictorial representation (through a cross sectional view) illustrating the structure of FIG. 18 after annealing in an appropriate environment.

Reference is now made to FIGS. 17-19 which illustrate a technique for patterning a semiconductor substrate that is capable of forming an alloy with an oxygen reactive element during a subsequent annealing step. The resultant patterned substrate can be used in various applications including, for example, in semiconductor device manufacturing, optoelectronic device manufacturing and solar cell device manufacturing. Referring first to FIG. 17, there is illustrated an initial structure 300 that can be employed in this embodiment of the invention. The initial structure 300 includes a patterned oxide layer 14' located on a surface of a semiconductor substrate 302. The patterned oxide layer 14' includes at least one opening 16 that exposes a surface of substrate 302. Semiconductor substrate 302 includes any semiconductor material which is capable of forming a compound semiconductor alloy with an oxygen reactive element during subsequent processing. The semiconductor substrate 302 includes, for example, III-V compound semiconductors and II-VI compound semiconductors. In one embodiment, the semiconductor substrate 302 is composed of GaAs, GaN, InAs or InP. In one preferred embodiment, GaAs is employed as the semiconductor substrate 302.

It is observed that the patterned oxide layer 14' is composed of oxide material as described for oxide layer 14, and the patterned oxide layer 14' is formed by lithography and etching as described above for the embodiment described within FIGS. 1-5.

Referring now to FIG. 18, there is illustrated the structure of FIG. 17 after forming an oxygen reactive element-containing layer 18 on the exposed surfaces of the structure including on the exposed upper surfaces of the semiconductor substrate 302 as well as the upper surfaces of the patterned oxide layer 14'. The oxygen reactive element-containing layer 18 is composed of the same oxygen reactive element as described above, has a thickness within the range mentioned above, and it is formed utilizing one of the techniques mentioned above.

Referring now to FIG. 19, there is illustrated the structure of FIG. 18 after performing an annealing process. The annealing process that is employed in this step of the invention is the same as described previously within FIGS. 1-5, except that in this case an overpressure of a secondary element may be needed. The later case is requisite when one of the components of the semiconductor does not alloy with the oxygen reactive material. In one preferred embodiment, GaAs is employed as the semiconductor substrate 302 and Al as the oxygen reactive element within layer 18. In this case during the anneal the Al alloys with the Ga in the GaAs releasing the As into the gaseous environment and an overpressure of As will be needed to compensate this. So that as the system is cooled, As reacts with the AlGa alloy forming a GaAlAs compound semiconductor alloy.

As is illustrated in FIG. 19, the annealing process employed in this embodiment of the present invention causes the oxygen reactive element within layer 18 to react with the oxygen within the patterned oxide layer 14' forming a patterned compound oxide layer 20 that includes a combination of the elements within layers 14' and 18. For example, when the patterned oxide layer 14' comprises silicon oxide and the oxygen reactive element-containing layer 18 includes Al, the annealing process provides a patterned compound oxide layer 20 that includes atoms of Al, Si and oxygen. It is observed that the above mentioned reaction occurs in areas in which the oxygen reactive element-containing layer 18 is in direct contact with the patterned oxide layer 14'. It is further observed that both layers 14' and 18 can be completely or partially consumed during this annealing process. In some embodiments, a portion of the patterned oxide layer 14' which is in proximity to the upper surface of semiconductor substrate 302 may not be completely consumed.

Unlike the previous embodiments, the oxygen reactive element-containing layer 18 that is located directly on the exposed surface of the semiconductor substrate 302 reacts with a surface portion of substrate 302 forming an oxygen reactive element-containing compound semiconductor alloy layer 304 on the remaining portions of substrate 302. Thus, FIG. 19 illustrates a patterned substrate that includes the remaining portions of the semiconductor substrate 302 and at least one area of oxygen reactive element-containing compound semiconductor alloy layer 304 thereon.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method comprising:
   providing a patterned oxide layer on a semiconductor substrate, said patterned oxide having at least one opening that exposes an upper surface of said semiconductor substrate;
   forming an oxygen reactive element-containing layer on an upper surface of said patterned oxide layer and on said exposed upper surface of said semiconductor substrate;
   performing an anneal process which forms a compound oxide layer in areas in which said oxygen reactive element-containing layer is in direct contact with said upper surface of said patterned oxide, said anneal process further forms a non-oxidized seed material in areas in which said element-containing layer is in direct contact with said exposed upper surface of said semiconductor substrate;
   growing semiconductor nanowires from said non-oxidized seed material; and
   removing said non-oxidized seed material from a tip of each semiconductor nanowire after growing said semiconductor nanowires.

2. The method of claim 1 wherein said providing said patterned oxide layer on said semiconductor substrate includes deposition of a blanket oxide layer on said semiconductor substrate, lithography and etching.

3. The method of claim 1 wherein said forming said oxygen reactive element-containing layer includes selecting as the oxygen reactive element one of Al, In, Ga, Ti, Mg, Ca or Sn.

4. The method of claim 1 wherein said anneal process is performed at a temperature that is equal to, or greater than, 200° C.

5. The method of claim 1 wherein said growing said nanowires includes selecting a semiconductor nanowire precursor, and performing nanowire growth at a temperature from 200° C. to 2000° C. utilizing chemical vapor deposition, ultra high vacuum chemical vapor deposition or plasma enhanced chemical vapor deposition.

6. The method of claim 1 wherein said providing the patterned oxide layer includes selected a semiconductor oxide layer, a metal oxide layer or a multilayered stack thereof as an oxide material for said patterned oxide layer.

7. The method of claim 1 wherein said patterned oxide layer includes silicon oxide or germanium oxide.

8. The method of claim 1 wherein said patterned oxide layer includes a metal oxide selected from the group consisting of ZnO, NiO, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, and $Y_2O_xN_y$, wherein each value of x is independently from 0.5 to 3 and each value of y is independently from 0 to 2.

9. The method of claim 1 wherein said oxygen reactive element-containing layer is not exposed to air or an oxygen containing environment prior to said growing the semiconductor nanowires.

10. The method of claim 1 wherein said performing the anneal process includes selecting a furnace anneal, a laser anneal, a microwave anneal or a rapid thermal anneal.

11. The method of claim 1 wherein said performing the anneal process is carried out at a temperature that is equal to, or greater than an eutectic temperature of an alloy of an oxygen reactive-element and said semiconductor substrate.

12. The method of claim 1 wherein said performing the anneal is carried out at a temperature above 577° C.

13. The method of claim 1 wherein said semiconductor nanowires are silicon semiconductor nanowires.

14. The method of claim 1 wherein said semiconductor nanowires have a same crystal orientation as the semiconductor substrate.

15. A method comprising:
   providing a layer of polymeric spheres on an oxide layer that is located on a semiconductor substrate, said layer of polymeric spheres having at least one opening that exposes an upper surface of said oxide layer;
   annealing and oxygen plasma treating said layer of polymeric spheres to form a plurality of annealed and oxygen plasma treated polymeric spheres on said oxide layer;
   etching said exposed upper surface of said oxide layer utilizing said plurality of annealed and oxygen treated polymeric spheres as an etch mask to form a patterned oxide layer having at least one opening that exposes an upper surface of said semiconductor substrate;
   removing said plurality of annealed and oxygen treated polymeric spheres;
   forming an oxygen reactive element-containing layer on said patterned oxide layer and on said exposed upper surface of said semiconductor substrate;
   performing an anneal process which forms a compound oxide layer in areas in which said oxygen reactive element-containing layer is in direct contact with said upper surface of said patterned oxide layer, said anneal process further forms a non-oxidized seed material in areas in which said oxygen reactive element-containing layer is in direct contact with said exposed upper surface of said semiconductor substrate; and growing semiconductor nanowires from said non-oxidized seed material.

16. The method of claim 15 wherein said providing said layer of polymeric spheres includes utilizing a spinning process.

17. The method of claim 15 wherein said forming said oxygen reactive element-containing layer includes selecting as the oxygen reactive element one of Al, In, Ga, Ti, Mg, Ca or Sn.

18. The method of claim 15 wherein said anneal process is performed at a temperature that is equal to, or greater than, 200° C.

19. The method of claim 15 wherein said growing said nanowires includes selecting a semiconductor nanowire precursor, and performing nanowire growth at a temperature from 200° C. to 2000° C. utilizing chemical vapor deposition, ultra high vacuum chemical vapor deposition or plasma enhanced chemical vapor deposition.

20. The method of claim 15 further comprising removing said non-oxidized oxygen reactive seed material from a tip of each semiconductor nanowire after growing said semiconductor nanowires.

* * * * *